US010557199B2

(12) United States Patent
Kikuchi

(10) Patent No.: US 10,557,199 B2
(45) Date of Patent: Feb. 11, 2020

(54) HEAT TREATMENT APPARATUS

(71) Applicant: TOKYO ELECTRON LIMITED, Tokyo (JP)

(72) Inventor: Masahiro Kikuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 238 days.

(21) Appl. No.: 15/254,393

(22) Filed: Sep. 1, 2016

(65) Prior Publication Data

US 2017/0073811 A1    Mar. 16, 2017

(30) Foreign Application Priority Data

Sep. 11, 2015    (JP) ................................. 2015-179409

(51) Int. Cl.
*C23C 16/455*    (2006.01)
*C23C 16/44*    (2006.01)

(52) U.S. Cl.
CPC ...... *C23C 16/4557* (2013.01); *C23C 16/4405* (2013.01); *C23C 16/45557* (2013.01); *C23C 16/45578* (2013.01)

(58) Field of Classification Search
CPC ............ C23C 16/4587; C23C 16/4412; C23C 16/455; C23C 16/45561; C23C 16/4583; C23C 16/4557; C23C 16/45557; C23C 16/45578; C23C 16/4405; C30B 25/14; C30B 25/10; C30B 25/12; F27B 17/0025; F27B 1/00

See application file for complete search history.

(56) References Cited

U.S. PATENT DOCUMENTS

| 5,522,934 A * | 6/1996 | Suzuki ................. C23C 16/455 118/723 AN |
| 2008/0083372 A1* | 4/2008 | Inoue .................... C23C 16/345 118/725 |
| 2010/0154711 A1* | 6/2010 | Ishibashi ........... C23C 16/45502 118/725 |

(Continued)

FOREIGN PATENT DOCUMENTS

| JP | 06-005533 | 1/1994 |
| JP | 2008-041915 A | 2/2008 |

(Continued)

*Primary Examiner* — Aiden Lee
(74) *Attorney, Agent, or Firm* — Nath, Goldberg & Meyer; Stanley N. Protigal; Jerald L. Meyer

(57) ABSTRACT

A heat treatment apparatus includes: a vertically-extended reaction tube for accommodating a substrate holder with substrates are vertically stacked therein; a gas supply duct integrally formed with the reaction tube to extend in a longitudinal direction of the reaction tube; gas supply holes formed in a region of an outer circumferential wall of the reaction tube and configured to bring an interior of the gas supply duct and an interior of the reaction tube into communication with each other; a preheating duct communicating with the gas supply duct, integrally formed with the reaction tube to extend along the longitudinal direction of the reaction tube up to a predetermined position of a predetermined height existing in the vicinity of an upper end of the outer circumferential wall of the reaction tube; and a pressure-resistant container for covering the reaction tube, the gas supply duct and the preheating duct.

14 Claims, 6 Drawing Sheets

(56) References Cited

U.S. PATENT DOCUMENTS

2013/0316545 A1* 11/2013 Yamaguchi ....... H01L 21/02118
438/781

FOREIGN PATENT DOCUMENTS

| JP | 2010153467 A | 7/2010 |
|---|---|---|
| JP | 2010-239142 A | 10/2010 |
| JP | 2013-045884 A | 3/2013 |

* cited by examiner

HEAT TREATMENT APPARATUS

CROSS-REFERENCE TO RELATED APPLICATION

This application claims the benefit of Japanese Patent Application No. 2015-179409, filed on Sep. 11, 2015, in the Japan Patent Office, the disclosure of which is incorporated herein in its entirety by reference.

TECHNICAL FIELD

The present disclosure relates to a heat treatment apparatus.

BACKGROUND

In the related art, there is known a heat treatment apparatus in which a duct is installed outside a reaction tube and gas injection holes for bringing the interior of the duct and the interior of the reaction tube into communication with each other are formed in an outer wall of the reaction tube so that a gas is supplied from the duct into the reaction tube through the gas injection holes. With this configuration, it is not necessary to install an injector for supplying a gas between an inner wall of the reaction tube and substrates. This makes it possible to reduce a clearance between the inner wall of the reaction tube and the substrates. In this heat treatment apparatus, the interior of the reaction tube is vacuum-exhausted during a heat treatment and the outside of the reaction tube is kept at an atmospheric pressure level. Thus, a high pressure is applied to the outside of the duct communicating with the interior of the reaction tube which is a vacuum region. Accordingly, the duct needs to be a structure having a pressure resistance property.

Furthermore, as a substrate processing apparatus having a similar structure, there is known a substrate processing apparatus in which a plurality of injection holes is formed in an outer wall of a substantially cylindrical process chamber and a tube is installed so as to surround the vicinity of a central region of the process chamber in a longitudinal direction. A cylindrical space sandwiched by the process chamber and the tube is used as a gas introduction space. A gas introduced into the process chamber is heated in advance within the gas introduction space having a large surface area. In this substrate processing apparatus, a partition plate extending in a vertical direction is installed within the gas introduction space and a zigzag-like flow path extending up and down is formed.

However, in the conventional heat treatment apparatus, the gas is supplied to the duct as a flow orientated from a bottom portion of the reaction tube toward a top portion thereof. Thus, the supplied gas in the bottom portion of the reaction tube is not sufficiently pyrolized although the supplied gas in the top portion of the reaction tube is sufficiently pyrolized. As a result, the heat treatment of the substrates disposed in the bottom portion of the reaction tube is less sufficient than the heat treatment of the substrates disposed in the top portion of the reaction tube. Thus, there may be a case where a difference in treatment amount occurs between the substrates disposed in the top portion of the reaction tube and the substrates disposed in the bottom portion of the reaction tube.

Furthermore, in the conventional substrate processing apparatus, the gas introduction space is formed in the vicinity of the middle portion of the reaction tube in a height direction. However, in a vertical substrate processing apparatus, a region existing near the top portion of the reaction tube is a region where a temperature is easy to rise. Thus, there is a problem in that the efficiency of pyrolysis is not so high. In addition, the flow path is formed by the partition late within the tube. This poses a problem in that it is difficult to freely form the flow path.

SUMMARY

Some embodiments of the present disclosure provide a heat treatment apparatus which is capable of forming a flow path at a high degree of freedom, sufficiently performing pyrolysis of a gas, and uniformly performing a heat treatment regardless of mounting positions of substrates within a reaction tube.

According to an embodiment of the present disclosure, there is provided a heat treatment apparatus, including: a substantially-cylindrical reaction tube extending in a vertical direction, and configured to accommodate a substrate holder in which a plurality of substrates is stacked in the vertical direction; a gas supply duct integrally formed with the reaction tube on an outer circumferential wall of the reaction tube to extend in a longitudinal direction of the reaction tube; gas supply holes formed in a region of the outer circumferential wall of the reaction tube covered with the gas supply duct, and configured to bring an interior of the gas supply duct and an interior of the reaction tube into communication with each other; a preheating duct communicating with the gas supply duct, integrally formed with the reaction tube on the outer circumferential wall of the reaction tube, and installed so as to extend along the longitudinal direction of the reaction tube up to a predetermined position of a predetermined height existing in the vicinity of an upper end of the outer circumferential wall of the reaction tube; and a pressure-resistant container configured to cover the reaction tube, the gas supply duct and the preheating duct from the outside.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
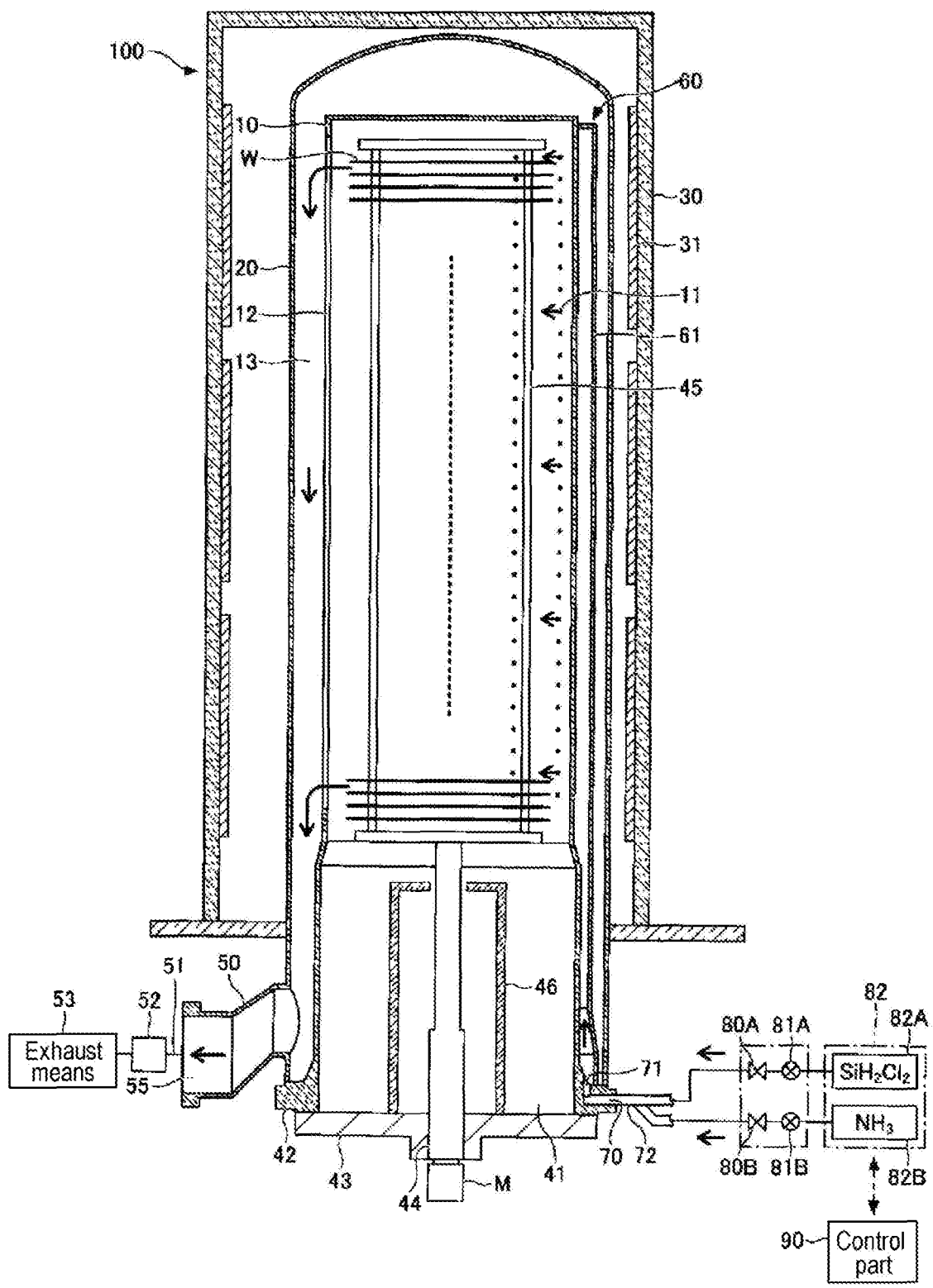
FIG. 1 is a sectional view of one example of a heat treatment apparatus according to a first embodiment of the present disclosure.

FIG. 1 is a sectional view of one example of a heat treatment apparatus according to a first embodiment of the present disclosure. A heat treatment apparatus 100 includes a reaction tube 10, a pressure-resistant container 20, a tubular heat insulation body 30, a gas supply duct 60 and a preheating duct 61.

The reaction tube 10 is a process chamber which accommodates wafers W and which performs a heat treatment with respect to the accommodated wafers W. The reaction tube 10 has a vertically-elongated substantially-cylindrical shape which is suitable for accommodating the wafers W staked in a vertical direction. The reaction tube 10 is made of, for example, quartz.

The pressure-resistant container 20 is a container which covers the reaction tube 10, the gas supply duct 60 and the preheating duct 61 and which protects the gas supply duct 60 and the preheating duct 61 from a pressure of an atmospheric pressure level. Furthermore, an exhaust path is formed between an inner circumferential wall of the pressure-resistant container 20 and an outer circumferential wall of the reaction tube 10. Thus, the pressure-resistant container 20 is formed in a substantially cylindrical shape and is slightly larger than the reaction tube 10.

The tubular heat insulation body 30 is made of, for example, a heat insulation material, and has a function of shielding the heat treatment apparatus 100 so that the heat of the heat treatment apparatus 100 is not dissipated to the outside. Annular heaters 31 extending along a circumferential direction are installed on an inner wall surface of the tubular heat insulation body 30. The heaters 31 are heating parts for heating the reaction tube 10. The heaters 31 are divided in an up-down direction and are installed in multiple stages. In FIG. 1, the heaters 31 are divided in three stages and are configured so that the interior of the reaction tube 10 can be controlled on a zone-by-zone basis by independently controlling the temperatures of the respective heaters 31. As the heaters 31, it may be possible to use, for example, heaters in which a carbon wire heater formed by knitting plural bunches of high-purity carbon fibers is sealed in ceramics. The heaters 31 are not limited thereto. For example, a metallic body made of iron-chromium-nickel alloy may be as the heaters 31.

A base end side (lower end side) of the reaction tube 10 is opened as a furnace opening. A flange 42 is formed in a peripheral edge of the opening 41. The opening 41 is configured so that the opening 41 can be kept in a vacuum-sealed state by the flange 42 and a lid 43 capable of being moved up and down by a boat elevator (not shown).

A wafer boat 45, which is a holder for holding a plurality of (e.g., 100) wafers W in a shelf-like manner, is installed on the lid 43. The wafer boat 45 is loaded into or unloaded from the reaction tube 10 with the up-down movement of the lid 43. A rotary shaft 44 which penetrates through a heat insulation unit 46 and the lid 43 is installed in a lower portion of the wafer boat 45. The rotary shaft 44 is configured so that the rotary shaft 44 is rotated by a motor M as a drive part attached to the boat elevator (not shown). Thus, the wafer boat 45 is rotated together with the rotary shaft 44 with the rotation of the motor M.

An exhaust port 50 through which the interior of the reaction tube 10 is exhausted, is formed in a lateral surface of the reaction tube 10 at the side of the opening 41 as the base end side of the reaction tube 10. An exhaust part 53 such as a vacuum pump, which is capable of depressurizing the interior of the reaction tube 10, is coupled to a discharge path 55 of the exhaust port 50 via an exhaust pipe 51 provided with a pressure regulation part 52 formed of, for example, a butterfly valve. While the exhaust port 50 has been described to be formed at the base end side of the reaction tube 10 in this embodiment, the exhaust port 50 may be formed at a distal end side (upper end side) of the reaction tube 10. The exhaust port 50 may be formed at one (one end side) of the base end side and the distal end side of the reaction tube 10.

In the outer circumferential wall of the reaction tube 10, the gas supply duct 60 is integrally formed with the sidewall of the reaction tube 10 so as to extend along the outer circumferential surface of the sidewall of the reaction tube 10 in the longitudinal direction. The gas supply duct 60 is a duct for supplying a gas into the reaction tube 10. Thus, the gas supply duct 60 is installed so as to cover gas supply holes 11 which are formed to extend through the outer circumferential wall of the reaction tube 10.

Similarly, in the outer circumferential wall of the reaction tube 10, the preheating duct 61 is integrally formed with the sidewall of the reaction tube 10 so as to extend along the outer circumferential surface of the sidewall of the reaction tube 10 in the longitudinal direction in a substantially parallel relationship with the gas supply duct 60. The preheating duct 61 is a duct for heating a gas before the gas is supplied to the reaction tube 10. Thus, the preheating duct 61 is installed so as to communicate with the gas supply duct 60 and not to communicate with the reaction tube 10. In other words, a closed space is formed by the outer circumferential wall of the reaction tube 10 and the preheating duct 61. Configurations of the gas supply duct 60 and the preheating duct 61 will be described later in detail.

Figure 2:
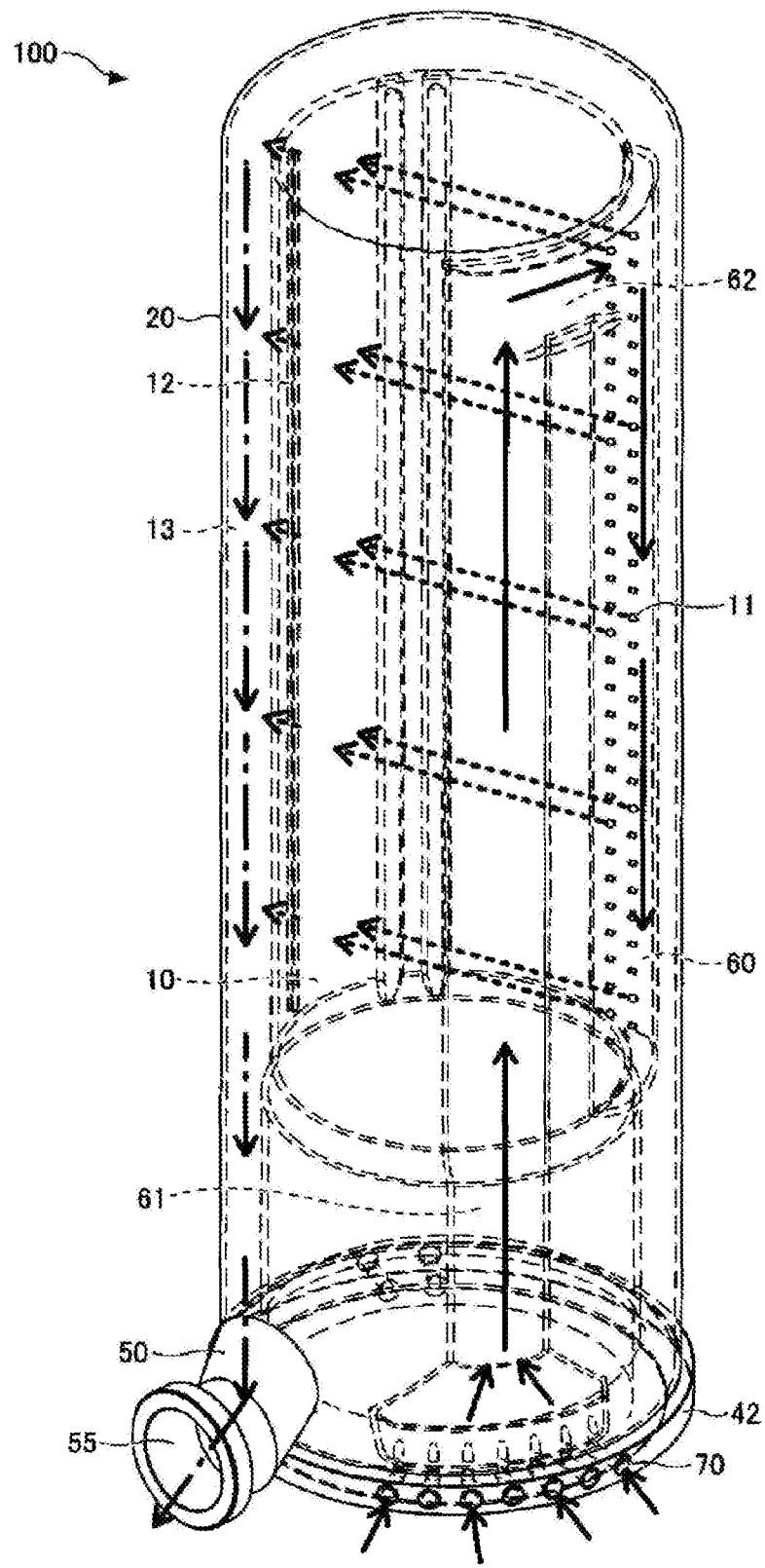
FIG. 2 is a perspective view illustrating a configuration of one example of a reaction tube and a pressure-resistant container of the heat treatment apparatus according to the first embodiment of the present disclosure.

As illustrated in FIGS. 1 and 2, a plurality of gas flow paths 70 is formed within the flange 42 along the circumferential direction (In FIG. 1, the gas flow paths 70 overlap in the depth direction of the drawing and, therefore, some of the gas flow paths 70 are not shown). The tip sides of the respective gas flow paths 70 are opened as gas introduction holes 71 at the root portion of the flange 42. For example, seven gas supply pipes 72 are connected to the base end sides of the respective gas flow paths 70 so as to communicate with the gas introduction holes 71. More specifically, for example, the tip portions of the gas supply pipes 72 are inserted into the gas flow paths 70 from the outside, so that the gas supply pipes 72 and the ports formed in the outer end surface of the flange 42 are air-tightly sealed. It can be said that the gas supply pipes 72 existing within the flange 42 constitutes a portion of the gas flow paths 70. The gas supply pipes 72 are respectively connected to different gas supply sources so that various kinds of film forming processes or a cleaning process can be performed. For example, one gas supply pipe 72 is connected to, e.g., a SiH$_2$Cl$_2$ (dichlorosilane) gas source 82A via a valve 80A and a flow rate control part 81A. For example, another gas supply pipe 72 is connected to, e.g., a NH$_3$ (ammonia) gas source 82B via a valve 80B and a flow rate control part 81B. A further gas supply pipe 72 is connected to, e.g., a cleaning gas source (not shown). The SiH$_2$Cl$_2$ (dichlorosilane) gas source 82A and the NH$_3$ gas source 82B constitute a gas source 82.

The heat treatment apparatus 100 includes a control part 90. The control part 90 is a control means for controlling the overall operations of the heat treatment apparatus 100. The control part 90 is formed of a computer including, for example, a central processing unit (CPU), a memory and the like. For example, a recipe, which stores process conditions such as various kinds of film forming conditions, a cleaning condition and the like, may be set by a reading means. A program stored in the recipe may be installed. The control part 90 may be configured to control the operations of individual components of the heat treatment apparatus 100 according to the recipe. The control part 90 also controls internal pressures of the reaction tube 10, the gas supply duct 60 and the preheating duct 61. Details thereof will be described later.

Next, the configurations of the gas supply duct 60 and the preheating duct 61 of the heat treatment apparatus according to the first embodiment of the present disclosure and the configuration of a connection duct will be described in more detail.

FIG. 2 is a perspective view illustrating a configuration of one example of the reaction tube 10 and the pressure-resistant container 20 of the heat treatment apparatus according to the first embodiment of the present disclosure. As illustrated in FIG. 2, the gas supply duct 60 and the preheating duct 61 are installed in the outer circumferential wall of the substantially-cylindrical reaction tube 10. Furthermore, the gas supply duct 60 and the preheating duct 61 are connected to each other via a connection duct 62. The substantially-cylindrical pressure-resistant container 20 surrounds the reaction tube 10, the gas supply duct 60, the preheating duct 61 and the connection duct 62. The exhaust port 50 is connected to the lower portion of the pressure-resistant container 20. Furthermore, the flange 42 and the gas flow paths 70 are formed in the lower portion of the reaction tube 10.

The preheating duct 61 is coupled to the gas flow paths 70 via the gas introduction holes 71. The preheating duct 61 extends upward from the gas flow paths 70 along the longitudinal direction of the reaction tube 10 and reaches the upper end of the sidewall of the reaction tube 10. At the upper end of the sidewall of the reaction tube 10, the preheating duct 61 is connected to the gas supply duct 60 via the connection duct 62 extending in the horizontal direction.

The gas supply duct 60 extends downward from the upper end of the sidewall of the reaction tube 10 and reaches a predetermined position. The gas supply holes 11, which bring the interior of the reaction tube 10 and the interior of the gas supply duct 60 into communication with each other, are formed in a region of the sidewall of the reaction tube 10 covered with the gas supply duct 60. A length of the gas supply duct 60 in the longitudinal direction of the reaction tube 10 is set at a length enough to cover the mounting extent of the wafers W mounted to the wafer boat 45. Thus, a gas from the gas supply holes 11 is directly supplied to all the wafers W. The gas supply holes 11 are arranged in the vertical direction and are also arranged in the horizontal direction. This makes it possible to dispersedly supply a gas and to enhance inter-plane uniformity and in-plane uniformity when performing a heat treatment.

On the other hand, the gas supply holes 11 are not formed in a region of the sidewall of the reaction tube 10 covered with the preheating duct 61. The gas introduced from the gas flow paths 70 is merely sent to the gas supply duct 60. During the time when the gas passes through the interior of the preheating duct 61, the gas is pyrolized by the heat received from the heaters 31 and the reaction tube 10. This makes it possible to supply the gas to the gas supply duct 60 in a sufficiently pyrolized state.

An exhaust opening 12 is formed in the inner wall surface of the reaction tube 10 facing the gas supply holes 11. The exhaust opening 12 is formed to exhaust the interior of the reaction tube 10. The exhaust opening 12 communicates with the discharge path 55 formed by the exhaust port 50. In FIG. 2, the exhaust opening 12 is formed as a vertically-elongated exhaust slit. In some embodiments, the exhaust opening 12 may be formed of a plurality of exhaust holes arranged in the vertical direction. An exhaust path 13 communicating with the exhaust port 50 is formed between the outer wall surface of the reaction tube 10 and the inner wall surface of the pressure-resistant container 20.

In the heat treatment apparatus 100, if the preheating duct 61 is not installed and if the gas is directly supplied from the gas introduction holes 71 to the lower side of the gas supply duct 60, it is confirmed that while a sufficient heat treatment can be always performed in the upper portion of the reaction tube 10, a heat treatment may become insufficient in the lower portion of the reaction tube 10. Thus, in the heat treatment apparatus 100 according to this embodiment, in order to perform a sufficient heat treatment in all the regions of the wafers W, the preheating duct 61 is configured to extend to the upper end of the reaction tube 10 so that the gas is supplied to the gas supply duct 60 through the upper end of the reaction tube 10. By doing so, the entire gas is supplied into the reaction tube 10 in a sufficiently-pyrolized state. Thus, it is possible to perform a sufficient heat treatment with respect to all the wafers W regardless of the mounting positions of the wafers W in the vertical direction and to perform an uniform process with respect to all the wafers W. In general, the process performed in the heat treatment apparatus is a film forming process. By employing this configuration, it is possible to form films on all the wafers W with a uniform film thickness and a uniform film quality.

In FIG. 2, the preheating duct 61 is extended to reach the upper end of the sidewall of the reaction tube 10. However, it is not necessarily required that the preheating duct 61 is extended to reach the upper end of the sidewall of the reaction tube 10. It is sufficient to have the preheating duct 61 extend up to a predetermined position of a predetermined height or more where the pyrolysis of the gas sufficiently occurs. As an example, the preheating duct 61 may be extended to reach the height of the uppermost wafer W among the wafers W mounted on the wafer boat 45. Alternatively, the preheating duct 61 may be extended to reach the position of at least the tenth wafer W from the top. It is confirmed that at least the tenth wafer W from the top can be sufficiently heat-treated even when the preheating duct 61 does not exist. Thus, if the preheating duct 61 is installed at a predetermined position higher than the tenth wafer W, it is possible to send the gas to the gas supply duct 60 in a sufficiently-pyrolized state. Furthermore, it is not necessarily required that the connection duct 62 is installed at the upper end of the sidewall of the reaction tube 10. As an example, at the middle point between the preheating duct 61 and the gas supply duct 60, the preheating duct 61 and the gas supply duct 60 may be connected to each other in an H-like shape. However, even in this case, the height of the connection duct 62 may be set at a height at which pyrolysis sufficiently occurs in the preheating duct 61.

While in FIG. 2, the preheating duct 61 and the gas supply duct 60 has been shown to extend up and down once, the preheating duct 61 and the gas supply duct 60 may extend up and down multiple times or may be disposed so as to surround the entire circumference of the reaction tube 10. Further, while in FIG. 2, the preheating duct 61 and the gas supply duct 60 has been shown to be installed independently of each other and to be connected by the connection duct 62, the preheating duct 61 and the gas supply duct 60 may be integrally installed in an adjoining relationship with each other. In some embodiments, a partition wall may be installed so as to divide the preheating duct 61 and the gas supply duct 60.

As described above, the preheating duct 61, the gas supply duct 60 and the connection duct 62 may have different shapes depending on an intended use. The interior of the pressure-resistant container 20 is vacuum-exhausted by the exhaust part 53 such as a vacuum pump or the like connected to the exhaust pipe 51. Thus, a high pressure is applied to the pressure-resistant container 20 due to a pressure difference between the internal pressure of the pressure-resistant container 20 and the external pressure substantially equal to the atmospheric pressure. By installing the pressure-resistant container 20, it is possible to protect the preheating duct 61, the gas supply duct 60 and the connection duct 62 from a pressure and to prevent deformation of the preheating duct 61, the gas supply duct 60 and the connection duct 62. If the preheating duct 61, the gas supply duct 60 and the connection duct 62 are exposed to the ambient air, a high pressure is applied to the preheating duct 61, the gas supply duct 60 and the connection duct 62. Thus, it is required that the preheating duct 61, the gas supply duct 60 and the connection duct 62 are formed to have a pressure-resistant structure. This may impose restrictions to the shape, the arrangement and the configuration of the ducts. In this embodiment, a triple-tube structure in which the pressure-resistant container 20 is installed at the outer side, is employed. Thus, it is possible to form the preheating duct 61, the gas supply duct 60 and the connection duct 62 in many different shapes and to dispose the preheating duct 61, the gas supply duct 60 and the connection duct 62 at a high degree of freedom.

Further, the preheating duct 61, the gas supply duct 60 and the connection duct 62 may be made of various materials and may have various configurations as long as they are integrally formed with the reaction tube 10. As an example, the reaction tube 10, the preheating duct 61, the gas supply duct 60 and the connection duct 62 may be made of quartz and may be integrally formed by welding. That is to say, the heat treatment apparatus 100 according to the first embodiment can be configured by integrally or individually forming the preheating duct 61, the gas supply duct 60 and the connection duct 62, and by connecting and fixing the preheating duct 61, the gas supply duct 60 and the connection duct 62 to the outer circumferential wall of the reaction tube 10. In addition, the pressure-resistant container 20 may be made of, for example, quartz.

Next, descriptions will be made on a gas flow within the reaction tube.

Figure 3:
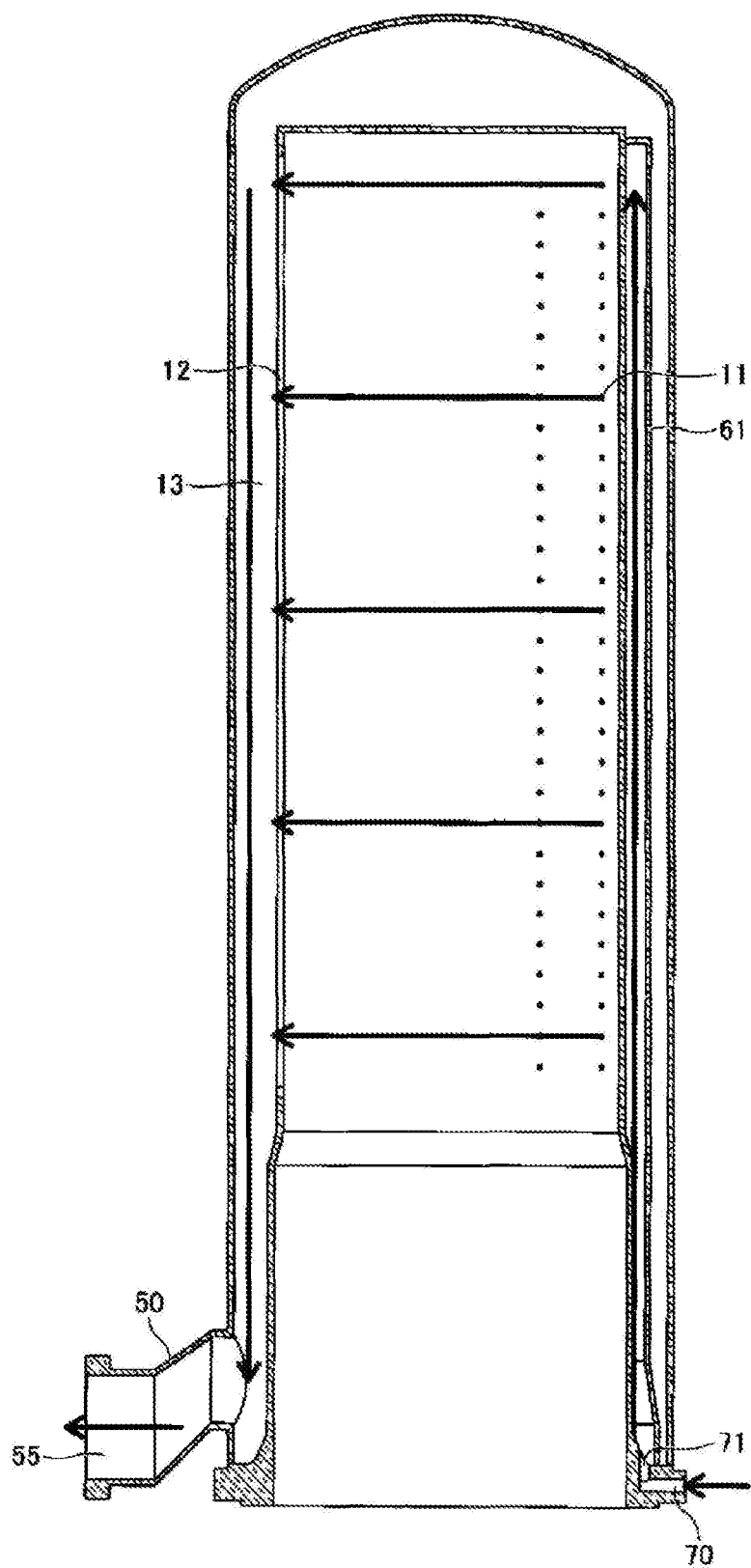
FIG. 3 is a vertical sectional view illustrating the configuration of one example of the reaction tube and the pressure-resistant container of the heat treatment apparatus according to the first embodiment of the present disclosure.
Figure 4:
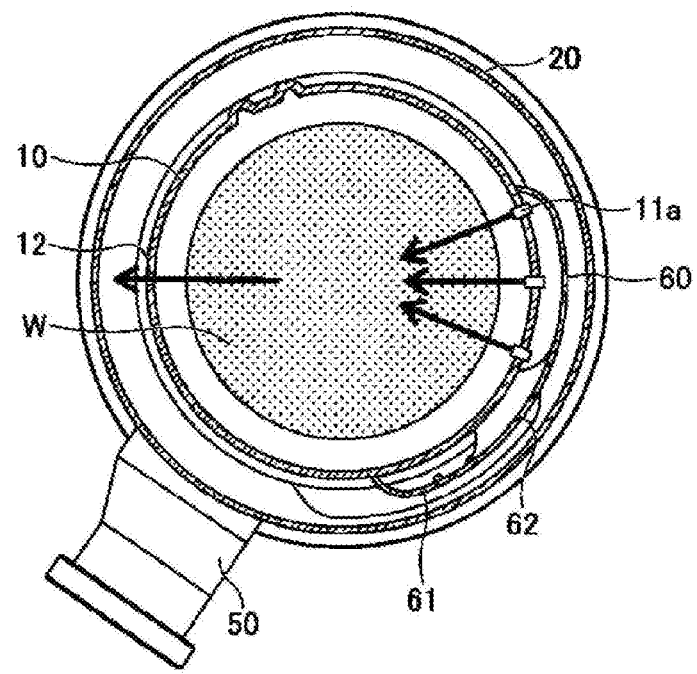
FIG. 4 is a horizontal sectional view illustrating a configuration of one example of the reaction tube, the pressure-resistant container, a gas supply duct, a preheating duct and a connection duct of the heat treatment apparatus according to the first embodiment of the present disclosure.

FIG. 3 is a vertical sectional view illustrating the configuration of one example of the reaction tube 10 and the pressure-resistant container 20 of the heat treatment apparatus 100 according to the first embodiment of the present disclosure. FIG. 4 is a horizontal sectional view illustrating the configuration of one example of the reaction tube 10, the pressure-resistant container 20, the gas supply duct 60, the preheating duct 61 and the connection duct 62 of the heat treatment apparatus 100 according to the first embodiment of the present disclosure. FIG. 4 illustrates a horizontal cross section of the upper portion of the heat treatment apparatus 100 in which the connection duct 62 exists.

As illustrated in FIG. 3, the gas introduced through the gas flow paths 70 and the gas introduction holes 71 is supplied from the gas supply holes 11 of the gas supply duct 60 into the reaction tube 10 via the preheating duct 61. The gas is supplied as a horizontal side flow. Then, the gas is exhausted through the exhaust opening 12 facing the gas supply holes 11 and is exhausted from the exhaust port 50 via the exhaust path 13.

During the supply of the gas, as illustrated in FIG. 4, the gas can be supplied in multiple directions by disposing the gas supply holes 11 along the horizontal direction, constituting the respective gas supply holes 11 as pipe lines 11a to design the orientation of the gas. In FIG. 4, three pipe lines 11a are installed and the respective pipe lines 11a are oriented toward the center of the wafer W. This makes it possible to supply the gas toward the center of the wafer W. It is possible to exhaust the gas from the exhaust opening 12 formed as a vertically-elongated exhaust slit, thus forming horizontal side flows. By forming the multidirectional side flows in this way, it is possible to supply the gas while uniformly dispersing the gas in the plane of the wafer W, thus enhancing the film thickness uniformity of the film thus formed.

Furthermore, in some embodiments, as illustrated in FIG. 4, the gas supply duct 60, the preheating duct 61 and the connection duct 62 may be formed as ducts having a curved surface shape with roundness. The gas supply duct 60, the preheating duct 61 and the connection duct 62 may have different shapes depending on an intended use.

In the supply of the gas during a heat treatment, an internal gas supply pressure of the gas supply duct 60, the preheating duct 61 and the connection duct 62 may be set to become equal to an internal processing pressure of the reaction tube 10 as far as possible. In other words, the gas needs to be supplied from the gas supply duct 60, the preheating duct 61 and the connection duct 62 into the reaction tube 10. Thus, it is natural that the internal gas supply pressure of the gas supply duct 60, the preheating duct 61 and the connection duct 62 is set to become higher than the internal processing pressure of the reaction tube 10. In some embodiments, a difference between the internal gas supply pressure of the gas supply duct 60, the preheating duct 61 and the connection duct 62 and the internal processing pressure of the reaction tube 10 may be set as small as possible. If the internal gas supply pressure of the gas supply duct 60, the preheating duct 61 and the connection duct 62 grows high, the thickness of films formed inside the gas supply duct 60, the preheating duct 61 and the connection duct 62 becomes larger than the thickness of films formed inside the reaction tube 10. It is therefore difficult to perform a cleaning work. That is to say, if the internal gas supply pressure of the gas supply duct 60, the preheating duct 61 and the connection duct 62 is set to become twice as high as the internal processing pressure of the reaction tube 10, the thickness of films formed inside the gas supply duct 60, the preheating duct 61 and the connection duct 62 becomes twice of the thickness of films formed inside the reaction tube 10. Thus, if cleaning is performed in conformity with the thickness of films formed inside the gas supply duct 60, the preheating duct 61 and the connection duct 62, the damage of the interior of the reaction tube 10 caused by the cleaning increases. On the other hand, if cleaning is performed in conformity with the thickness of films formed inside the reaction tube 10, there may be generated a situation where the films formed inside the gas supply duct 60, the preheating duct 61 and the connection duct 62 cannot be completely cleaned.

Thus, during the heat treatment, it is desirable that the internal gas supply pressure of the gas supply duct 60, the preheating duct 61 and the connection duct 62 is set close to the internal processing pressure of the reaction tube 10 as long as the supply of the gas is not hindered. This setting is performed by appropriately controlling the internal gas supply pressure of the gas supply duct 60, the preheating duct 61 and the connection duct 62 and the internal processing pressure of the reaction tube 10 with the control part 90.

Figure 5B:
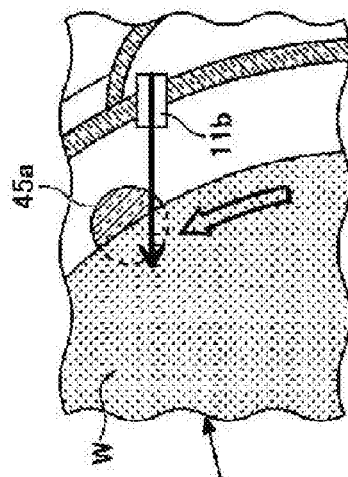
FIGS. 5A to 5C are views illustrating one example of a heat treatment apparatus according to a second embodiment of the present disclosure, FIG. 5A being a horizontal sectional view of one example of the heat treatment apparatus according to the second embodiment of the present disclosure, FIG. 5B being a first partially-enlarged view of FIG. 5A, and FIG. 5C being a second partially-enlarged view of FIG. 5A.
Figure 5C:
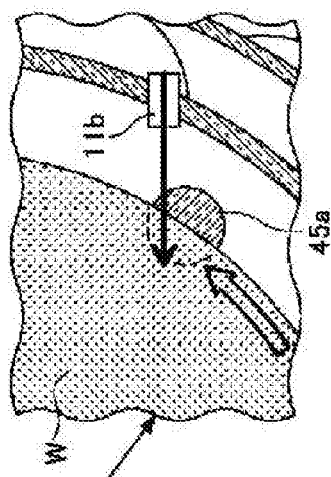
Figure 5A:
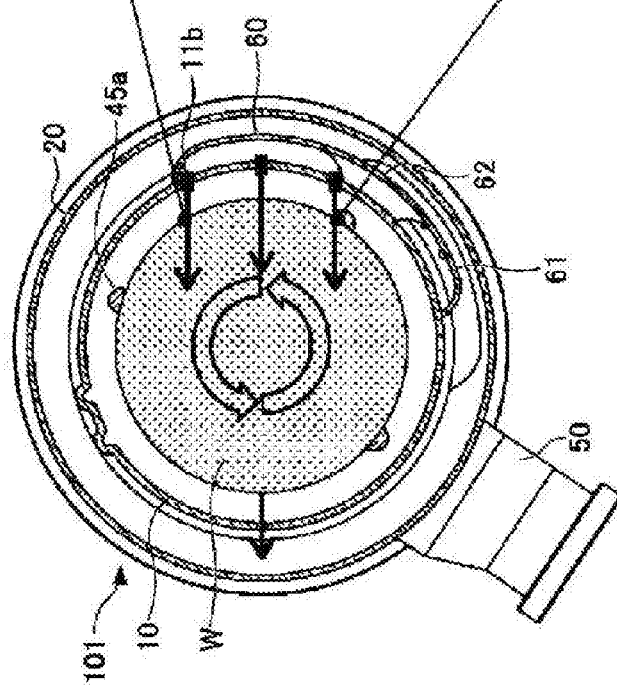

FIGS. 5A to 5C are views illustrating one example of a heat treatment apparatus according to a second embodiment of the present disclosure. FIG. 5A is a horizontal sectional view of one example of the heat treatment apparatus according to the second embodiment of the present disclosure. FIGS. 5B and 5C are partially-enlarged views of FIG. 5A.

As illustrated in FIG. 5A, the heat treatment apparatus 101 according to the second embodiment remains the same as the heat treatment apparatus 100 according to the first embodiment in terms of the configurations of the reaction tube 10, the pressure-resistant container 20, the gas supply duct 60, the preheating duct 61 and the connection duct 62 but differs from the heat treatment apparatus 100 according to the first embodiment only in terms of the configuration of pipe lines 11b of the gas supply paths.

The heat treatment apparatus 101 according to the second embodiment differs from the heat treatment apparatus 100 according to the first embodiment in that the pipe lines 11b are not oriented toward the centers of the wafers W but are parallel to one another. In this way, the pipe lines 11b may be oriented parallel to one another. The wafer boat 45 for holding the wafers W includes three or more posts 45a which support the wafers W at the inner side thereof. Thus, if the gas is supplied toward only the front sides of the posts 45a, there is a possibility that due to the shadows of the posts 45a, regions not supplied with the gas are generated in spite of the rotation of the wafer boat 45.

Figure 6:
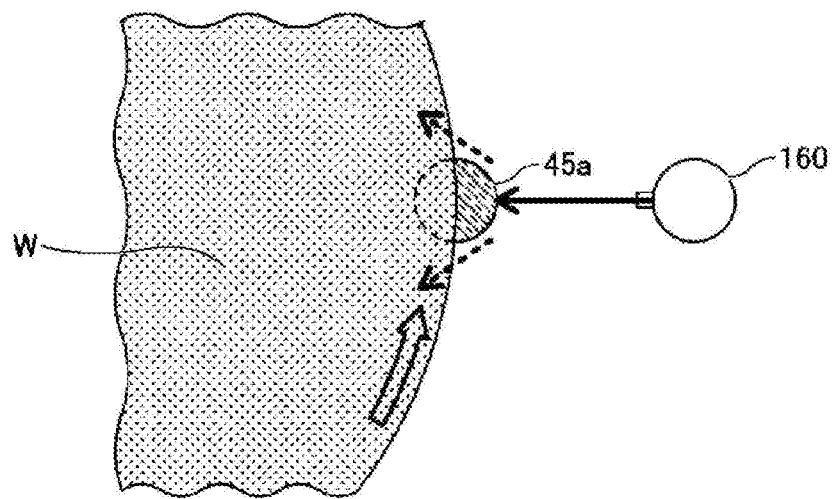
FIG. 6 is view illustrating an example in which a region not supplied with a gas is generated on a wafer W.

FIG. 6 is view illustrating an example in which a region not supplied with the gas is generated on the wafer W. As illustrated in FIG. 6, if the gas is supplied from an injector 160 (a gas supply pipe installed within a reaction tube of a heat treatment apparatus of the type differing from the heat treatment apparatus of the present disclosure) toward only the front side of the post 45a, there is a possibility that a region not supplied with the gas is generated at the rear side of the post 45a. The post 45a is disposed perpendicularly with respect to the tangential line of the wafer W. Thus, if the gas is supplied only toward the center of the wafer W, there is a possibility that all the gas supply holes come into the arrangement state illustrated in FIG. 6.

By installing the pipe lines 11b parallel to one another as illustrated in FIGS. 5B and 5C, it is possible to generate variations of an angle with respect to the post 45a and to supply the gas to the rear side of the post 45a.

By appropriately adjusting the supply direction of the gas in this way, it is possible to further enhance the uniformity of gas supply to the wafer W.

Next, as one example of a heat treatment method using the aforementioned heat treatment apparatus 100 or 101, a case where a SiN film is formed on a surface of a silicon wafer (hereinafter referred to as a "wafer W") by a CVD method will be described.

First, the wafer boat 45 holding, for example, 100 wafers W, is loaded into the reaction tube 10 using a boat elevator (not shown). Thereafter, the lid 43 is moved up to seal the reaction tube 10. The interior of the reaction tube 10 is depressurized to, for example, 27 Pa (0.2 Torr), by the exhaust part 53, and the interior of the reaction tube 10 is heated to a predetermined process temperature, for example, 650 degrees C., by the heaters 31. Then, the valves 80A and 80B are opened. The $SiH_2Cl_2$ gas and the $NH_3$ gas as process gases supplied from the gas sources 82A and 82B are introduced from the gas introduction holes 71 of the upper surface of the flange 42 into the preheating duct 61 via the gas supply pipes 72 and the gas flow paths 70 formed within the flange 42. These process gases move upward through the preheating duct 61 while being heated and reach the vicinity of the upper end of the sidewall of the reaction tube 10. The process gases are supplied into the gas supply duct 60 via the connection duct 62 in a sufficiently-pyrolyzed state. Then, the process gases are supplied from the gas supply holes 11 into the reaction tube 10 and are supplied as side flows to the respective wafers W mounted on the wafer boat 45 rotated by the motor M. Thereafter, the process gases react with each other on the surfaces of the wafers W and SiN films are formed on the surfaces of the respective wafers W. Unreacted process gases or gases containing a reaction byproduct are exhausted from the exhaust opening 12 and are exhausted by the exhaust part 53 from the exhaust pipe 51 connected to the exhaust port 50 of the lower portion of the reaction tube 10 via the exhaust path 13.

During the gas supply, the internal gas supply pressure of the gas supply duct 60, the preheating duct 61 and the connection duct 62 is set at a pressure value higher than the internal processing pressure of the reaction tube 10, but close to the internal processing pressure as far as possible. By appropriately using the pipe lines 11a or 11b as the gas supply holes 11, the process gases are supplied in such a direction as to enhance the in-plane uniformity of film formation.

Since the gas supply duct 60, the preheating duct 61 and the connection duct 62 are covered with the pressure-resistant container 20, it is possible to perform an arrangement design at a high degree of freedom.

As described above, according to the heat treatment apparatus of the embodiments of the present disclosure, it is possible to perform uniform film formation regardless of the mounting positions of the wafers W within the reaction tube 10 while installing the gas supply duct 60, the preheating duct 61 and the connection duct 62 at a high degree of freedom.

According to the present disclosure in some embodiments, it is possible to sufficiently and uniformly perform a heat treatment of substrates regardless of the mounting positions of the substrates while maintaining a high degree of freedom of design in disposing a gas supply duct.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus, comprising:
a substantially-cylindrical reaction tube extending in a vertical direction, and configured to accommodate a substrate holder in which a plurality of substrates is stacked in the vertical direction;
a gas supply duct integrally formed with the reaction tube on an outer circumferential wall of the reaction tube to extend in a longitudinal direction of the reaction tube;
gas supply holes configured as pipe lines to bring an interior of the gas supply duct and an interior of the reaction tube into communication with each other, the pipe lines being oriented parallel to one another to supply a gas to the substrates in a mutually-parallel relationship;
a preheating duct integrally formed with the reaction tube on the outer circumferential wall of the reaction tube, and installed so as to extend along the longitudinal direction of the reaction tube up to a predetermined position of a predetermined height existing in a vicinity of an upper end of the outer circumferential wall of the reaction tube;
a connection duct configured to connect the preheating duct and the gas supply duct; and
a pressure-resistant container configured to cover the reaction tube, the gas supply duct and the preheating duct from the outside,
wherein the gas supply holes are formed in a region of the outer circumferential wall of the reaction tube covered with the gas supply duct, and not formed in a region of the reaction tube covered with the preheating duct,
wherein a closed space is formed by the outer circumferential wall of the reaction tube and the preheating duct, and
wherein the gas supply duct and the gas supply holes are formed to cover a mounting region of the substrates mounted on the substrate holder along the longitudinal direction of the reaction tube.

2. The apparatus of claim 1, wherein the gas supply duct and the gas supply holes are installed over an extent covering a stacking region of the substrates stacked in the substrate holder in the longitudinal direction of the reaction tube.

3. The apparatus of claim 1, wherein the predetermined height is a position at which, a tenth substrate from an uppermost substrate of the plurality of substrates stacked in the vertical direction is mounted.

4. The apparatus of claim 1, wherein the predetermined position is the upper end of the outer circumferential wall of the reaction tube.

5. The apparatus of claim 1, wherein the pressure-resistant container has a substantially cylindrical shape.

6. The apparatus of claim 1, wherein a plurality of gas introduction holes is connected to the preheating duct.

7. The apparatus of claim 1, wherein the preheating duct and the gas supply duct are connected to each other at the predetermined position of the outer circumferential wall of the reaction tube and have a folded shape at the predetermined position.

8. The apparatus of claim 1, wherein the preheating duct and the gas supply duct are independently formed in a spaced-apart relationship with each other.

9. The apparatus of claim 1, wherein the preheating duct and the gas supply duct are integrally formed in an adjoining relationship with each other and are partitioned by a partition wall.

10. The apparatus of claim 1, wherein an exhaust opening is formed in a surface of the reaction tube facing the gas supply holes.

11. The apparatus of claim 10, wherein the exhaust opening is formed by a plurality of holes arranged in the longitudinal direction.

12. The apparatus of claim 10, wherein the exhaust opening is an exhaust slit extending in the longitudinal direction.

13. The apparatus of claim 10, wherein an exhaust port communicating with the exhaust opening is connected to the pressure-resistant container.

14. The apparatus of claim 1, further comprising: a control part configured to control an internal supply pressure of the gas supply duct so that the internal supply pressure of the gas supply duct becomes slightly higher than an internal processing pressure of the reaction tube.

* * * * *